United States Patent
Vu et al.

(10) Patent No.: US 6,395,129 B1
(45) Date of Patent: *May 28, 2002

(54) PROCESS TO DECAPSULATE A FBGA PACKAGE

(75) Inventors: Joseph L. Vu, San Jose; Mehrdad Mahanpour, Union City, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 31 days.

This patent is subject to a terminal disclaimer.

(21) Appl. No.: 09/722,232

(22) Filed: Nov. 27, 2000

(51) Int. Cl.[7] .............................................. H01L 21/00
(52) U.S. Cl. ................................................ 156/345.11
(58) Field of Search .................................... 156/345.11

(56) References Cited

U.S. PATENT DOCUMENTS

| | | | | |
|---|---|---|---|---|
| 4,826,556 A | * | 5/1989 | Kobayashi | 156/345 |
| 5,252,179 A | * | 10/1993 | Ellerson et al. | 156/656 |
| 5,443,675 A | * | 8/1995 | Wensink | 156/345 |
| 5,766,496 A | * | 6/1998 | Martin | 216/56 |
| 5,783,098 A | * | 7/1998 | Martin et al. | 216/56 |
| 5,792,305 A | * | 8/1998 | Winsemius et al. | 156/345 |
| 5,855,727 A | * | 1/1999 | Martin et al. | 156/345 |

* cited by examiner

*Primary Examiner*—Gregory Mills
*Assistant Examiner*—A. Michelle Crowell
(74) *Attorney, Agent, or Firm*—Davis Chin

(57) ABSTRACT

A fixture assembly of a unique construction is provided for use with a decapsulating machine so as to prevent damage to a FBGA package during decapsulation. The fixture assembly includes a retaining gasket for holding and aligning the FBGA package in the decapsulating machine, a spacer element for protecting the solder balls of the FBGA package, and a cover for receiving the pressure from a spring-loaded arm of the decapsulating machine. As a result, the FBGA package is prevented from being over etched by the sulfuric acid during decapsulation. In addition, damage to the solder balls are prevented due to excess pressure from the spring-loaded arm.

14 Claims, 3 Drawing Sheets

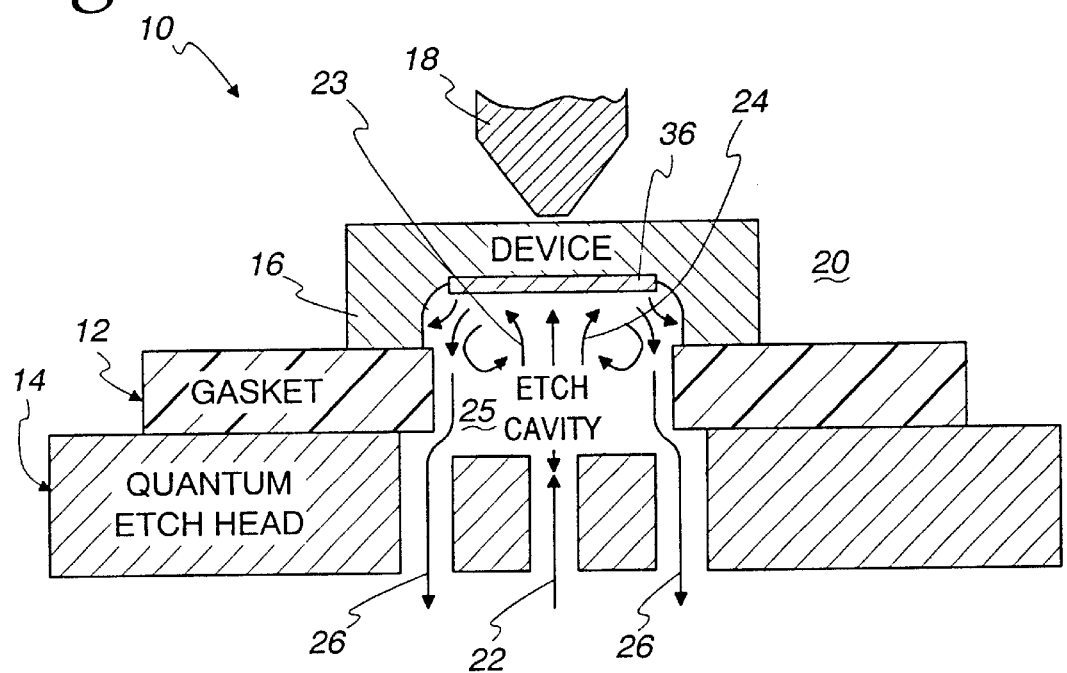
Fig. 1 *(Prior Art)*
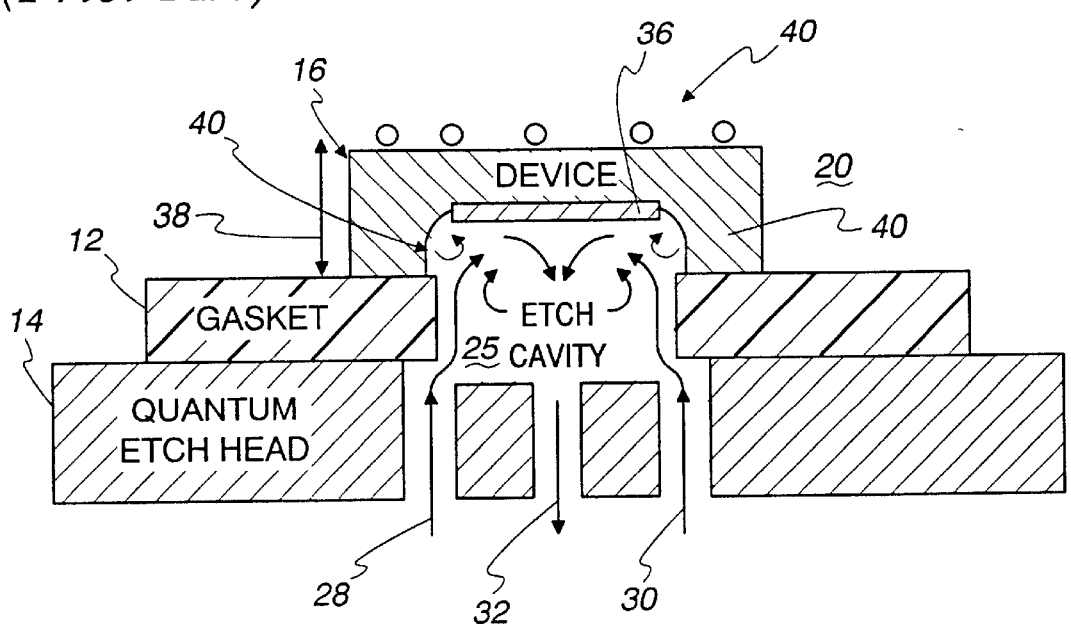
Fig. 2 *(Prior Art)*

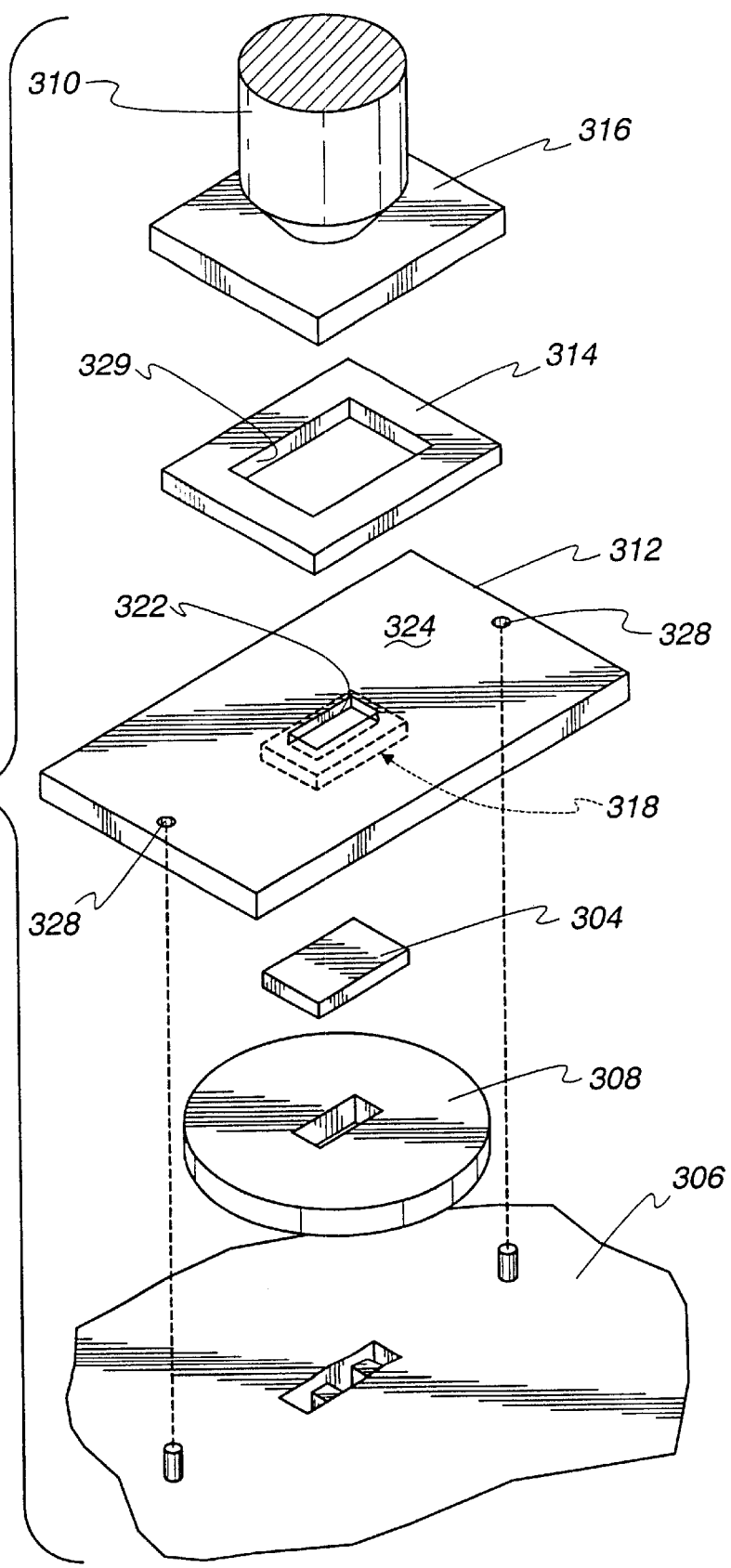

PROCESS TO DECAPSULATE A FBGA PACKAGE

BACKGROUND OF THE INVENTION

This invention relates generally to ball grid array (BGA) semiconductor packages and more particularly, it relates to an improved method and apparatus for use with a decapsulating machine so as to prevent damage to a fine ball grid array (FBGA) package during decapsulation.

As is generally well-known in the art, with the trend of increased densities in packaging semiconductor chips there has been developed fine ball grid array (FBGA) packages which permit the reduction of the semiconductor packaging profile as well as providing increased package density. Typically, the FBGA packages include a semiconductor die attached to a lead frame mounted on the top surface of a substrate. The semiconductor die is formed with a plurality of bond pads which are electrically connected with the lead frame of the substrate. Further, wire bonds are used to form the connection between the plurality of bond pads on the semiconductor die and terminal pads on the substrate. Conductive elements, such as solder balls, are bonded to conductive traces of the substrate. The semiconductor die, lead frame and wire bonds are encapsulated with a molding compound.

It is often desirable to decapsulate the integrated circuit from the semiconductor packaging after it has been completely fabricated without damaging the lead frame, bonding wires and the like of the integrated circuit. For example, it may be desirable to decapsulate the semiconductor packaging so as to allow for visual inspection of the internal areas thereof, testing and repair of the defective chips therein. Also, it is generally desirable to perform a failure analysis on any defective chips using an emission microscope or microprobing of the chip in order to determine the cause of the failure. The failure analysis is used to enhance reliability and reduce the number of defects in future semiconductor packages.

In the prior art, it is generally known heretofore of various apparatuses and methods for decapsulation of semiconductor packaging. These apparatuses and methods most commonly use hot concentrated acids such as sulfuric acid and nitric acid. One such prior art decapsulator is manufactured and sold by B & G International, Inc. of Soquel, Calif., under their Model 250. An enlarged cross-sectional view of a portion of the decapsulator is illustrated in FIG. 1 of the drawings, showing the primary etchant flow path. FIG. 2 is a view similar to FIG. 1, but shows the secondary etchant flow path.

As can be seen from FIG. 1, the decapsulator 10 includes an acid-resistant gasket 12 which is seated on a quantum etch head 14. A plastic semiconductor or FBGA package 16 to be decapsulated is positioned on top of the gasket 12. A process cover (not shown) is formed with a spring-loaded arm 18 which is used to apply pressure on the semiconductor package 16 when the process is initialized. The semiconductor package 16 and the gasket 12 are sealed and pressurized in a chamber 20 formed by the process cover.

A primary etchant flow (forward path), as indicated by arrows 22–24, produces symmetrically distributed micro-vortex eddy currents in an etch cavity 25 formed by the gasket 12, the semiconductor package 16, and the quantum etch head 14. The eddy currents are propagated outwardly from the etch cavity 25 along arrows 26. The acid is maintained in the etch cavity 25 for a short interval so as to attack the encapsulating material. After the primary etchant flow has been completed, a secondary etchant flow (reverse path), as indicated by arrows 28, 30 and 32 in FIG. 2, produces opposite micro-vortex eddy currents so as to etch the crevices remaining from the forward flow path. After the etching process is finished, the process cover is opened and the semiconductor package 16 is removed.

Unfortunately, various types of deficiencies have been encountered in this prior art B & G encapsulator 10. While not drawn to scale, for this FBGA package 16 the size of the semiconductor die 36 is much larger and the size of the plastic package cover 38 is much thinner than those existing in a conventional dual-in-line (DIP) plastic package. In other words, the die-size to the package-size ratio for the FBGA package 16 is much larger. As a result, this causes the areas 40 to be over-etched by the sulfuric acid during the encapsulation process, thereby damaging the bonding wires and the die in the package. Further, the solder balls 42, as shown in FIG. 2, are susceptible to being damaged or even destroyed due to excessive pressure applied from the spring-loaded arm 18 (FIG. 1).

Therefore, there still exists a need for a novel method and apparatus for use with a decapsulating machine so as to prevent damage to the FBGA package during decapsulation. This is achieved in the present invention by the provision of a fixture assembly of a unique construction struction which includes retaining means for holding and aligning the FBGA package in the decapsulating machine, spacer means for protecting the solder balls on the FBGA package, and cover means for receiving the pressure applied from the spring-loaded arm of the decapsulating machine.

SUMMARY OF THE INVENTION

Accordingly, it is a general object of the present invention to provide a novel method and apparatus for use with a decapsulating machine to decapsulate a FBGA package so as to facilitate failure analysis, which has been traditionally unavailable.

It is an object of the present invention to provide a novel method and apparatus for use with a decapsulating machine which permits failure analysis without damaging the FBGA package and the internal components thereof.

It is another object of the present invention to provide an improved method and apparatus for use with a decapsulating machine so as to prevent overetching a FBGA package during decapsulation.

It is still another object of the present invention to provide a fixture assembly for use with a decapsulating machine which includes retaining means for holding and aligning a FBGA package in a decapsulating machine, spacer means for protecting the solder balls on the FBGA package, and cover means for receiving the pressure applied from a spring-loaded arm of the decapsulating machine.

In a preferred embodiment of the present invention, there is provided a fixture assembly for use with a decapsulating machine so as to prevent damage to a FBGA package during decapsulation. The decapsulating machine includes an etch head, an etch-resistant gasket disposed on the top surface of the etch head, and a spring-loaded arm. A retaining gasket has a top surface formed with a recessed aperture and a bottom surface formed with a first central opening. The FBGA package is inserted into the central opening in the bottom surface of the retaining gasket so that the solder balls thereof face upwardly and extend into the recess aperture in the top surface of the retaining gasket.

The retaining gasket with the inserted FBGA package is secured and aligned with the etch-resistant gasket. A spacer element having a second central opening is disposed in alignment with the recessed aperture in the top surface of the retaining gasket so as to create a cavity above the solder balls. An unapertured cover is disposed over the spacer element so as to close the cavity and to receive the pressure applied from the spring-loaded arm of the decapsulating machine during decapsulation.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is an enlarged, cross-sectional view of a portion of a prior art decapsulating machine, illustrating the primary etchant flow path;

FIG. 2 is a view similar to FIG. 1, but illustrating the secondary etchant flow path;

FIG. 4 is an exploded, perspective view of the fixture assembly of the present invention shown in FIG. 3.

DESCRIPTION OF THE PREFERRED EMBODIMENT

Figure 3:
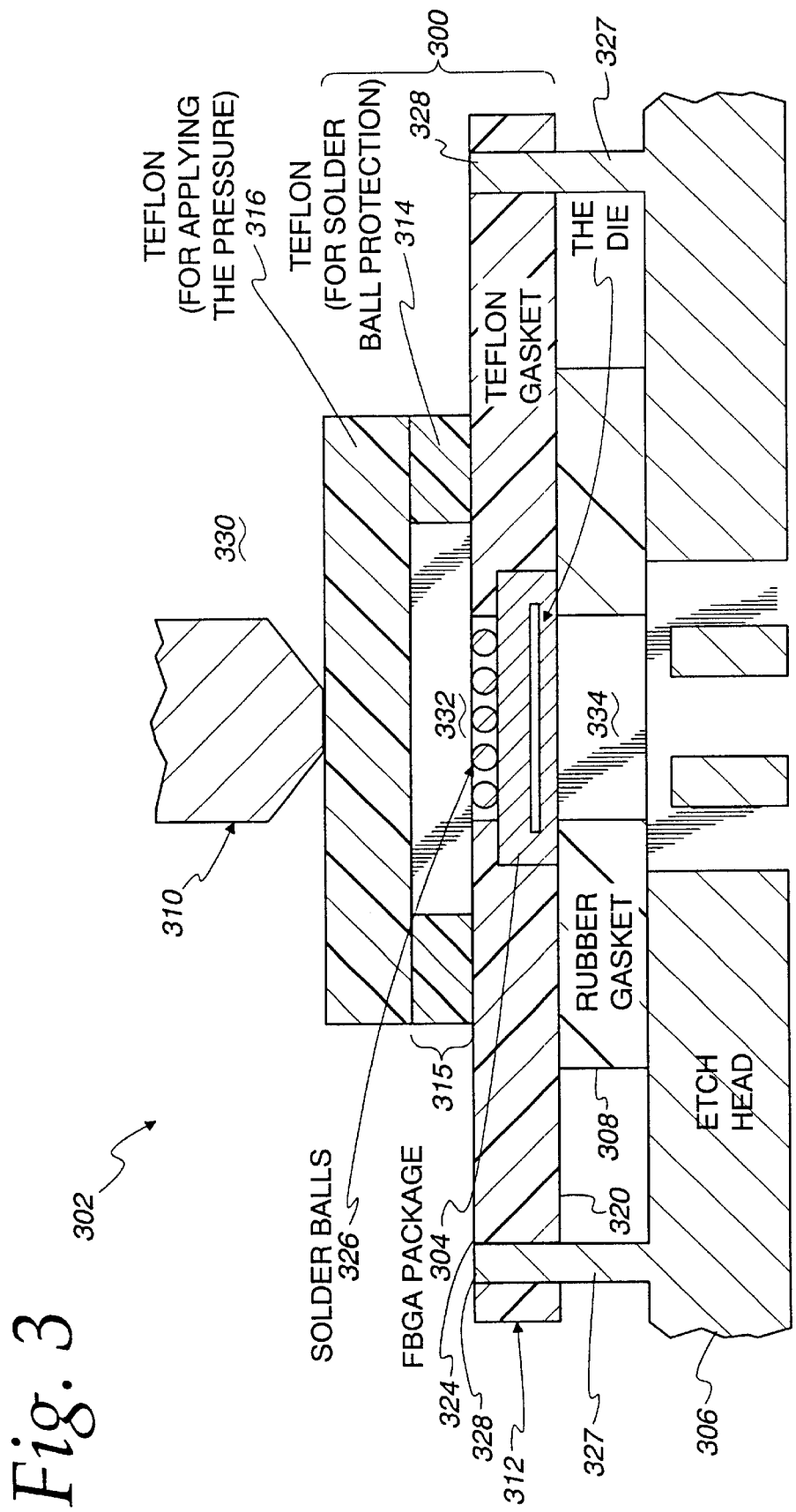
FIG. 3 is an enlarged, cross-sectional view of a fixture assembly, constructed in accordance with the principles of the present invention, for use with the decapsulating machine of FIG. 1 or FIG. 2.

Referring now to the drawings, there is illustrated an enlarged, cross-sectional view of a fixture assembly 300, constructed in accordance with the principles of the present invention. The fixture assembly 300 is particularly designed for use with a decapsulating machine 302 which is similar to the prior art B & G decapsulating machine 10 of FIG. 1 or FIG. 2 so as to prevent damaging of a FBGA package 304 to be decapsulated. The conventional decapsulating machine 302 includes an etch head 306, an etch-resistant gasket 308 disposed on top of the etch head 306, and a spring-loaded arm 310 for applying pressure to the fixture assembly 300. As a consequence, the fixture assembly 300 housing the FBGA package 304 therein is held by the spring-loaded arm 310 (which is part of a not-shown movable cover) against the top surface of the etch head 306 and is sealed thereto by the etch-resistant gasket 308. The gasket 308 is typically made of a rubber material so as to facilitate creating a vacuum seal.

As can be seen, the fixture assembly 300 is depicted in FIG. 3 in cross section and is comprised of a large retaining gasket 312, a spacer element 314, and a pressure-receiving cover 316. In FIG. 4, there is illustrated an exploded, perspective view of the fixture assembly 300 of FIG. 3. The retaining gasket 312 is formed of a rectangular shape having a first central opening 318 disposed in its bottom surface 320. The first central opening 318 is dimensioned so as to accommodate the outer physical size of the FBGA package 304. A centrally-located recessed aperture 322 is formed in the top surface 324 of the retaining gasket 312. The recessed aperture 322 is specifically dimensioned so as to allow clearance of the solder balls 326 formed on the bottom side of the FBGA package 304. The FBGA package is placed into the first central opening 318 from the underside of the retaining gasket 312 so that the solder balls 326 face upwardly and extend into the recessed aperture 322.

The retaining gasket 312 is further provided with mounting holes 328 for holding and aligning the FBGA package 304 with respect to the etch head 306. In order to create a tight vacuum seal, grease or the like is applied to the top surface of the rubber gasket 308 prior to positioning of the bottom surface 320 of the retaining gasket 312 with the FBGA package 304 therein against the rubber gasket 308. The rubber gasket 308 supports the peripheral edges of the top surface of the FBGA package 304 so as to hold the same within the first central opening 318.

The spacer element 314 is also formed of a rectangular shape having a second central opening 330 which is dimensioned to be slightly larger than the first central opening 318 of the retaining gasket 312. The thickness 315 of the spacer element 314 is made sufficient enough to provide a cavity 332 above the solder balls 326 for protecting them when the spacer element 314 is disposed in alignment over the retaining gasket 312. The pressure-receiving cover 316 is also formed of a rectangular shape which has substantially the same dimension as the spacer element 314 and is unapertured (blank). The cover 316 has a top side for receiving the pressure-applying arm 310 of the not-shown process cover of the decapsulating machine and has a bottom side abutting the top surface of the spacer element 314. Thus, the cover 316 and the spacer element 314 serve to protect the solder balls 326 from receiving any pressure due to the arm 310.

The retaining gasket 312, the spacer element 314, and the cover 316 are all preferably formed of a material that is resistant or not subject to attack by the sulfuric acid. Therefore, the material may be suitable formed of polytetrafluoroethylene (PTFE) Teflon or stainless steel. However, it should be apparent to those skilled in the art that other inert materials may be used dependent upon the type of etchant or solvent being utilized during the decapsulation process.

In use, the FBGA package 304 is placed initially into the central opening 318 of the retaining gasket 312 defining holding and aligning means of the fixture assembly 302. Next, grease is applied to the top surface of the rubber gasket 308 which is formed on top of the conventional etch head 306 of the decapsulating machine 302. Then, the bottom surface of the retaining gasket 312 with the FBGA package 304 therein is placed in alignment against the greased rubber gasket 308, and the retaining gasket is fixedly secured thereto by post members 327 or the like on the etch head 306 with the aligned mounting holes 328 of the retaining gasket. The spacer element 314 defining protection means is then placed on top of the retaining gasket 312 so that its central opening 329 is aligned with the recessed opening 322 of the retaining gasket. The cover 316 defining pressure-receiving means is arranged over the spacer element so as to close the cavity 332 above the solder balls 326. The spring-loaded arm 310 of the decapsulating machine 302 is lowered so as to apply pressure to the cover of the fixture assembly 300 so as to create a chamber 330. The etchant solution is circulated in the etch cavity 334 until the areas to be decapsulated have been completed. Finally, the spring-loaded arm 310 is raised, and the fixture assembly 300 is removed from the rubber gasket 308 and the etch head 306.

From the foregoing detailed description, it can thus be seen that the present invention provides a novel fixture assembly for use with a decapsulating machine so as to prevent damage to a FBGA package during decapsulation. The fixture assembly is comprised of a retaining gasket for holding and aligning the FBGA package in the decapsulating machine, a spacer element for protecting the solder balls on the FBGA package, and a cover for receiving the pressure applied from a spring-loaded arm of the decapsulating machine.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fixture assembly for use with a decapsulating machine so as to prevent damage to a FBGA package during decapsulation, said fixture assembly comprising in combination:

said decapsulating machine including an etch head, an etch-resistant gasket disposed on the top surface of said etch head, and a spring-loaded arm;

a retaining gasket having a top surface formed with a recessed aperture and a bottom surface formed with a first central opening;

said FBGA package being inserted into the first central opening in the bottom surface of said retaining gasket so that the solder balls thereof face upwardly and extend into the recessed aperture in the top surface of said retaining gasket;

said retaining gasket with said inserted FBGA package being sealed and aligned with said etch-resistant gasket;

a spacer element having a second central opening being disposed in alignment with said recessed aperture in the top surface of said retaining gasket so as to create a cavity above said solder balls; and an unapertured cover being disposed over said spacer element so as to close said cavity and to receive the pressure applied by the spring-loaded arm of said decapsulating machine during decapsulation.

2. A fixture assembly as claimed in claim 1, wherein grease is applied to the top surface of said etch-resistant gasket prior to said retaining gasket being secured thereon so as to facilitate forming a vacuum seal.

3. A fixture assembly as claimed in claim 2, wherein said etch-resistant gasket is made of a rubber material.

4. A fixture assembly as claimed in claim 3, wherein said retaining gasket, said spacer element and said unapertured cover are all formed of an etch-resistant material.

5. A fixture assembly as claimed in claim 4, wherein said etch-resistant material is PTFE.

6. A fixture assembly as claimed in claim 1, wherein said retaining gasket has a rectangular shape and is formed with mounting means for mating with said etch head.

7. A fixture assembly as claimed in claim 6, wherein said spacer element has a rectangular shape and has a thickness which is sufficiently adequate so as to provide the cavity above the solder balls.

8. A fixture assembly as claimed in claim 7, wherein said unapertured cover has a rectangular shape and is substantially equal in size to said spacer element, said cover having a bottom surface for closing said cavity and a top surface for receiving the pressure applied by said spring-loaded arm.

9. A fixture assembly for use with a decapsulating machine so as to prevent damage to a FBGA package during decapsulation, said fixture assembly comprising in combination:

said decapsulating machine including an etch head, an etch-resistant gasket disposed on the top surface of said etch head, and a spring-loaded arm;

retaining gasket means having a top surface formed with a recessed aperture and a bottom surface formed with a first central opening;

said FBGA package being inserted into the first central opening in the bottom surface of said retaining gasket means so that the solder balls thereof face upwardly and extend into the recessed aperture in the top surface of said retaining gasket means;

said retaining gasket means with said inserted FBGA package being sealed and aligned with said etch-resistant gasket;

spacer means having a second central opening being disposed in alignment with said recessed aperture in the top surface of said retaining gasket means so as to create a cavity above said solder balls; and unapertured cover means being disposed over said spacer means so as to close said cavity and to receive the pressure applied by the spring-loaded arm of said decapsulating machine during decapsulation.

10. A fixture assembly as claimed in claim 9, wherein grease is applied to the top surface of said etch-resistant gasket prior to said retaining gasket means being secured thereon so as to facilitate forming a vacuum seal.

11. A fixture assembly as claimed in claim 10, wherein said etch-resistant gasket is made of a rubber material.

12. A fixture assembly as claimed in claim 11, wherein said retaining gasket means, said spacer means and said unapertured cover means are all formed of an etch-resistant material.

13. A fixture assembly as claimed in claim 12, wherein said etch-resistant material is PTFE.

14. A method for use with a decapsulating machine so as to prevent damage to a FBGA package during decapsulation, said method comprising the steps of:

inserting the FBGA package into a first central opening in the bottom surface of a retaining gasket so that the solder balls thereof face upwardly and extend into a recessed aperture in the top surface of the retaining gasket;

mounting the retaining gasket with the inserted FBGA package therein in alignment with an etch-resistant gasket of the decapsulating machine;

placing a spacer element having a second central opening in alignment with the recessed aperture in the top surface of the retaining gasket so as to create a cavity above the solder balls; and placing an unapertured cover over the spacer element so as to close the cavity and to receive the pressure from a spring-loaded arm of the decapsulating machine during decapsulation.

* * * * *

UNITED STATES PATENT AND TRADEMARK OFFICE
CERTIFICATE OF CORRECTION

PATENT NO. : 6,395,129 B1
DATED : May 28, 2002
INVENTOR(S) : Joseph L. Vu et al.

It is certified that error appears in the above-identified patent and that said Letters Patent is hereby corrected as shown below:

Column 2,
Line 25, cancel "struction".

Signed and Sealed this

First Day of October, 2002

Attest:

Attesting Officer

JAMES E. ROGAN
Director of the United States Patent and Trademark Office